(12) United States Patent
Alzaher

(10) Patent No.: US 9,019,014 B2
(45) Date of Patent: Apr. 28, 2015

(54) PROGRAMMABLE MULTI-GAIN CURRENT AMPLIFIER

(71) Applicants: King Fahd University of Petroleum and Minerals, Dhahran (SA); King Abdulaziz City for Science and Technology, Riyadh (SA)

(72) Inventor: Hussain Alzaher, Dhahran (SA)

(73) Assignees: King Fahd University of Petroleum and Minerals, Dhahran (SA); King Abdulaziz City for Science and Technology, Riyadh (SA)

(*) Notice: Subject to any disclaimer, the term of this patent is extended or adjusted under 35 U.S.C. 154(b) by 37 days.

(21) Appl. No.: 13/953,713

(22) Filed: Jul. 29, 2013

(65) Prior Publication Data
US 2015/0028952 A1    Jan. 29, 2015

(51) Int. Cl.
*H03F 3/45*    (2006.01)
*H03G 3/30*    (2006.01)

(52) U.S. Cl.
CPC ......... *H03G 3/3052* (2013.01); *H03F 3/45179* (2013.01)

(58) Field of Classification Search
CPC ...................................................... H03F 3/45
USPC .................. 330/254, 257, 260, 261
See application file for complete search history.

(56) References Cited

U.S. PATENT DOCUMENTS

| | | | |
|---|---|---|---|
| 6,121,830 | A | 9/2000 | Manninen et al. |
| 6,617,926 | B2 | 9/2003 | Casper et al. |
| 7,425,867 | B2 * | 9/2008 | Aemireddy et al. .......... 330/257 |
| 7,583,147 | B2 * | 9/2009 | Ruck ............................. 330/261 |
| 7,902,924 | B2 | 3/2011 | Cao |

(Continued)

FOREIGN PATENT DOCUMENTS

| | | |
|---|---|---|
| JP | 2008-211535 | 9/2008 |
| TW | I332750 | 11/2010 |

OTHER PUBLICATIONS

Jetsdaporn Satansup, Tattaya Pukkalanun and Worapong Tangsrirat,"Current-Mode KHN Biquad Filter Using Modified CFTAs and Grounded Capacitors" Proceedings of the International MultiConference of Engineers and Computer Scientists 2011 vol. II. IMECS 2011, Mar. 16-18, 2011, Hong Kong, 4 pages.

(Continued)

*Primary Examiner* — Henry Choe
(74) *Attorney, Agent, or Firm* — Richard C Litman

(57) ABSTRACT

The programmable multi-gain current amplifier circuitry includes a pair of MOS transistors setting the voltage at X terminal to zero using negative feedback formed by a third MOS transistor. Input resistance is in the range of few tens of ohms. The input current $i_x$, which is forced by the constant currents of the circuitry, is conveyed to the output port Z by source-coupling a complementary output pair of MOS transistors. Since this coupled pair is biased with a constant tail current, the drain current changes are equal but with opposite sign, regardless of their matching resulting in negative type CA with unity gain ($i_z=i_x$). Programmability is achieved utilizing the output stages. When a second differential pair is connected in parallel, it provides two additional current outputs. With the two differential pairs being biased with different tail currents ($I_{T1}$ and $I_{T2}$), the outputs are programmed by adjusting these tail currents.

11 Claims, 8 Drawing Sheets

(56) References Cited

U.S. PATENT DOCUMENTS 7,965,118 B2* 6/2011 Seefeldt .................. 327/175
2007/0024369 A1 2/2007 Cao
2008/0106336 A1 5/2008 Pera
2010/0013557 A1 1/2010 Cao

OTHER PUBLICATIONS

Alzaher, H., and Ismail, M.: "Robust low-distortion wideband CMOS current-follower," Electron. Lett., Dec. 1999, vol. 35, No. 25, pp. 2203-2204.

Alzaher, H.: "A CMOS digitally programmable universal current-mode filter," IEEE Trans. Cir. Syst. II, 55, (8), Aug. 2008, pp. 758-762.

Alzaher, H., Alees, O., Tasadduq, N: "Programmable multi-gain current amplifier," IEEE Xplore Digital Library, Nov. 2012 and Jan. 3, 2013, pp. 421-428, and Abstract.

Kumngern, M., Moungnoul, P., Junnapiya, S., Dejhan, K.: "Current-mode universal filter using translinear current conveyors," 5th Int. Conf. on Electrical Engineering/Electronics, Comp., Telec. and Information Tech., 2008, 2, pp. 717-720.

* cited by examiner

US 9,019,014 B2

PROGRAMMABLE MULTI-GAIN CURRENT AMPLIFIER

BACKGROUND OF THE INVENTION

1. Field of the Invention

The present invention relates to current amplifier circuits, and in particular to a programmable multi-gain current amplifier.

2. Description of the Related Art

Filters utilizing current amplifiers (CAs), unlike the second generation current conveyer (CCII) and its extended versions are pure current-mode circuits wherein the primary signal variable is current. Basically, a CA is equivalent to a current controlled current source with gain α and ideally zero input impedance and infinite output impedance. It is often defined as a two terminal device that amplifies a current input signal applied at its low impedance input terminal X and conveys it to a high impedance output terminal Z. A current follower (CF) is a unity gain CA. From a certain point of view, it is the simplest current-mode device since it is a subpart of several devices such as CCII, current feedback amplifier (CFA) and transresistance amplifier (TRA).

In the area of filter design, CA based topologies avoid the use of any explicit or implicit voltage-mode active component leading to true current-mode signal processing circuits having the potential to operate at relatively high frequency and large signal swings. In fact, the bandwidth and the closed-loop gain are almost independent and a high voltage swing is not usually required. Known configurations include a current-mode Sallen-Key low-pass filter based on the CA and other filters based on CFs.

A current controlled current conveyer is widely used to provide the missing tuning feature of its CCII based counterparts. A programmable CA would be obtained from a CCCII by grounding its Y terminal. A programmable integrator can be obtained from a single output CCCII but this would require applying an input voltage (instead of the usual current signal) at the X-terminal of the CCCII. On the other hand, a current-mode programmable integrator can be obtained by using a dual-output CCCII adopting the topology described previously for the CA, or it can be obtained by using two CCCII.

Alternatively, electronically controllable CCIIs (ECCIIs) are obtained with the help of small-signal current amplifiers as suggested in the prior art. Basically, the sensed output current ($i_x$) of the voltage buffer stage is applied to the input of a current amplifier. The current amplifier amplifies $i_x$ and makes it available from a high output impedance terminal Z. The current gain of these current amplifiers is often a function of ratio between two biasing currents. Thus, the gain is controlled by varying these biasing currents. A BJT based ECCII is known in the art and complementary metal oxide semiconductor (CMOS) based ECCIIs are also known. In the known CMOS circuits, however, the maximum gain is limited by the size of some current mirror transistors (e.g. with equal size current mirrors the gain is limited to 2). Large transistors require large silicon area and result in limited bandwidth as they would be associated with larger practice capacitances. The known programmable CCII replaces the current amplifier with several cascaded current division cells. Each cell consists of seven transistors with the first two cells (among n cells) consuming 300 µA leading to an area and a power inefficient solution.

A CCII with both voltage and current gain called VCG-CCII is also known in the art. The voltage gain $V_x/V_y$, just like any voltage amplifier, suffers from gain-bandwidth product problems. Whereas the current gain $I_z/I_x$ is proportional to the small signal transconductance or output resistance of current mirroring transistors. The bandwidths of the current transfer characteristics of the VCG-CCII of these known works are limited to approximately 20 kHz and 1 MHz, respectively. In addition, the operation of these circuits is valid only for small signal processing, limiting their linearity.

A highly linear programmable CCII based on a programmable current mirror of [25] is also known in the art. However, this technique employs transistors operating in moderate inversion which results in low bandwidth (17 MHz) and limited tuning range. Adjustable current mirrors such as the known cell in the art can also be utilized but extending the design to produce multi-output would be associated with increased circuit complexity. Additional known art presents a single output programmable current amplifier employing two SINH or two TANH blocks, for example. But this known topology is clearly inefficient, since each of the two blocks consists of a CCII and a CM with adjustable gains. Another known technique is the design of a digitally controlled fully differential current conveyor (DCFDCCII). It utilizes two current division networks (CDN) in order to realize a single DCFDCCII.

In known current mirror CM based circuits, the input stage transconductance (basically 1/gm) is used for electronic programmability. Hence, it is possible to realize active-C filters based on CMs under the condition that each CM in the circuit topology is loaded by series resistance at the X terminal. In this case, the passive resistors would be replaced by the internal input resistance of the CM. An adjustable biasing current is used to vary the parasitic resistance (1/gm) of the CM's X-terminal. However, this approach cannot be employed to provide independent tuning characteristics since it is impossible to obtain different gains from the same device. This leads to filters exhibiting dependent pole frequencies and pole quality factors.

The second unattractive feature of these known filters is that various gains are often fixed to unity. A third problem with this known approach is that 1/gm is naturally nonlinear which significantly limits the linearity and the tuning range. Also, it can be seen that filters based on CM devices inherently cannot provide virtual ground input impedance (i.e., 1/gm is not ideally zero). Yet there remains the problem of gain programmability and a number of independently programmable outputs.

Thus, a programmable multi-gain current amplifier addressing the aforementioned problems is desired.

SUMMARY OF THE INVENTION

A novel multi-output current amplifier exhibiting independent electronically controllable gains is given. Its circuitry includes a pair of metal oxide semiconductor (MOS) transistors that set the voltage at X terminal to zero and with the help of negative feedback, formed basically by a third MOS transistor, an input resistance in the range of few tens of ohms is achieved. The input current $i_x$, which is forced by the biasing circuitry, is conveyed to the output port Z by a source-coupling a complementary output pair of MOS transistors instead of using current mirroring. Since this coupled pair is biased with a constant tail current, the drain current changes will be equal but with opposite sign, regardless of their matching resulting in negative type CA with unity gain ($i_z = i_x$). In this design of the CA, programmability feature is achieved utilizing the output stages instead of the input stage. For example, when a second differential pair is connected in parallel, it provides two additional current outputs. When the two differential pairs are biased with different tail currents ($I_{T1}$ and $I_{T2}$), the new two outputs ($i_{zP1}$ and $i_{zN1}$) would approximately be given by $$i_{zP1}=i_{zN1}=(I_{T2}/I_{T1})^{1/2}i_x. \quad (1)$$

Thus, the new outputs exhibit electronically controlled gains which can be programmed by adjusting the tail currents. Extra output currents with different gains can be obtained by adding more output stages with each stage providing both positive and negative signals.

These and other features of the present invention will become readily apparent upon further review of the following specification and drawings.

BRIEF DESCRIPTION OF THE DRAWINGS

Unless otherwise indicated, similar reference characters denote corresponding features consistently throughout the attached drawings.

DETAILED DESCRIPTION OF THE PREFERRED EMBODIMENTS

Figure 1:
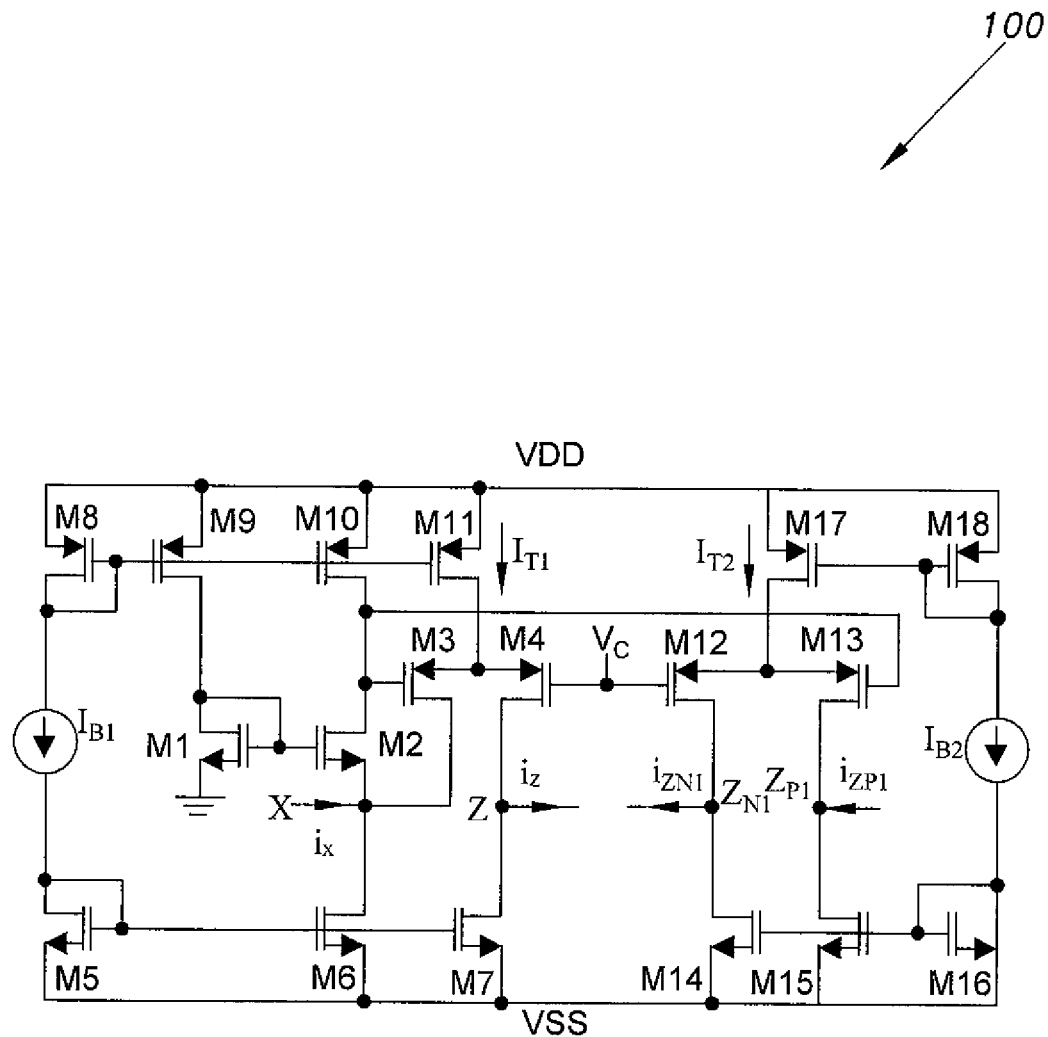
FIG. 1 is a circuit diagram of a current amplifier according to the present invention.

The programmable multi-gain current amplifier circuitry includes a power efficient current amplifier circuit (CA) 100 in which, as shown in FIG. 1, MOS transistors, for example are utilized. In the CA 100, a first set of transistors including transistors M1 and M2 set the voltage at X terminal to zero and with the help of negative feedback generated in the CA 100, formed basically by transistor M3, an input resistance in the range of few tens of ohms, such as approximately 50 ohms, is achieved. A current folding output stage including a second set of transistors is used to replace the normal current mirroring output stages and hence achieve a relatively robust linearity. The input current $i_x$, which is forced by the constant or substantially constant currents of transistors M2 and M6 to flow into transistor M3, is conveyed to the output port Z by source-coupling transistors M3 with M4 instead of using current mirroring, the second set of transistors forming a first differential pair or set and include the transistors M3 and M4. Since this coupled pair is biased with a constant or substantially constant tail current, the drain current changes in M3-M4 will be equal or substantially equal but with opposite sign, regardless of their matching resulting in negative type CA with unity gain ($i_z=i_x$), where an output current $i_z$ is equal or substantially equal to the input current $i_x$.

A second differential pair or set of transistors, including transistors M12-M13 is connected in parallel with second set of transistors that includes the transistors M3-M4 to provide two additional current outputs, for example. When the two pairs or sets are biased with different tail currents, it can be shown that the large signal current relationship will be given by:

$$I_{zP1} = I_{zN1} = \sqrt{\frac{I_{T2}}{I_{T1}}} \frac{\sqrt{1-(KV_d^2/4I_{T2})}}{\sqrt{1-(KV_d^2/4I_{T1})}} I_x, \quad (2)$$

where $V_d=V_c-V_{g3}$ (i.e., the differential voltage of the two source coupled pairs), $K=0.5\,\mu C_{ox}W/L$ with $\mu$ as the surface carrier mobility, $C_{ox}$ is the gate oxide capacitance per unit area, and W and L are the width and length of the channel. Thus, for small signals $Vd<<2[\min.\,(I_{T1},I_{T2})/K]^{1/2}$, the relationship simplifies to (1) above. Thus, the new outputs would exhibit electronically controlled gains which can be programmed by adjusting the tail currents. Extra output currents with different gains can be obtained by adding more output stages with each stage providing both positive and negative signals. The original output current $i_z$ is of negative type and associated with unity gain, and, hence, it can be utilized in the local feedbacks needed to form the lossless integrators. This is considered as an additional inherent advantage that makes the structure of FIG. 1 attractive for implementing two-integrator-loop filters. Moreover, the extra unused output terminals can always be utilized to provide notch and/or allpass responses simultaneously with the other functions if desired.

Figure 2:
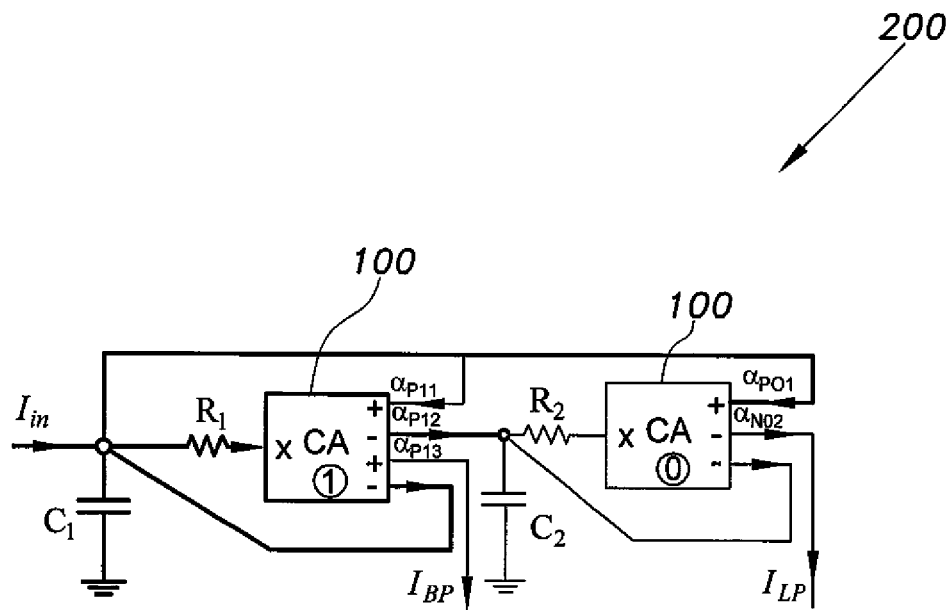
FIG. 2 is a block diagram of a Tow-Thomas emulating circuit using the current amplifier according to the present invention.

The filter 200 in FIG. 2 represents true current-mode filters based on CAs 100 emulating the well-known Tow-Thomas (TT) topology, for example. The filter 200 uses two integrators connected in cascade. This design is considered to be a more relatively power efficient solution for realizing the TT topology since at least two active elements 100 are required to simultaneously provide the BPF and LPF functions. This is achieved in the proposed topology by utilizing CAs with different gains as shown in FIG. 2.

The basic terminal characteristics of CAs can be expressed as $V_x=0$, $I_{zp}=\alpha_{Pij}I_x$ for positive outputs (the two currents have same direction with respect to the device) and $I_{zn}=\alpha_{Nij}I_x$ for negative outputs. The notations are selected such that the first number (i) in the subscript identifies the CAs whereas, the second number (j) denotes the output terminal assuming that unequal gains must be obtained from different output stages (e.g. $\alpha_{N01}$ is not used since it is assumed to be equal to $\alpha_{P01}$). Assuming unity gains for the negative outputs of the CAs employed in local feedbacks needed to form lossless integrators (their non-ideal effects are investigated infra), leads to the following transfer functions where $I_{lp}$ is a low pass current output, $I_{bp}$ is a band pass current output, $I_{in}$ is a source current, s is a Laplace transform parameter representing the complex frequency $j\omega$, the alpha-P ($\alpha_P$) are programming constants applied to positive differential outputs of the current amplifier circuit, alpha-N ($\alpha_N$) are programming constants applied to negative differential outputs of the current amplifier circuit, the ($\alpha_P$) and ($\alpha_N$) programming constants taking on values corresponding to respective differential pair tail currents, $\omega_0$ is a programmable pole frequency, $Q_0$ is a programmable pole quality factor, $G_{lp}$ is a programmable low pass gain, $G_{bp}$ is a programmable band pass gain, and where $C_1R_1$ is a product of a first integration RC circuit connected to the current amplifier, and $C_2R_2$ is a product of a second integration RC circuit connected to a second current amplifier:

$$\frac{I_{lp}}{I_{in}} = \frac{\alpha_{N02}\alpha_{N12}/C_1C_2R_1R_2}{s^2 + s\alpha_{P11}/C_1R_1 + \alpha_{N12}\alpha_{P01}/C_1C_2R_1R_2}, \text{ and} \quad (3)$$

$$\frac{I_{bp}}{I_{in}} = \frac{\alpha_{P13}s/C_1R_1}{s^2 + s\alpha_{P11}/C_1R_1 + \alpha_{N12}\alpha_{P01}/C_1C_2R_1R_2}. \quad (4)$$

Thus, the filter exhibits a pole frequency, a pole quality factor and gains of:

$$\omega_0 = \sqrt{\frac{\alpha_{N12}\alpha_{P01}}{C_1C_2R_1R_2}}, \quad (5)$$

$$Q_0 = \frac{\sqrt{\alpha_{N12}\alpha_{P01}}}{\alpha_{P11}}\sqrt{\frac{C_1R_1}{C_2R_2}}, \quad (6)$$

$$G_{lp} = \alpha_{N02}/\alpha_{P01}, \text{ and} \quad (7)$$

$$G_{bp} = \alpha_{P13}/\alpha_{P11}. \quad (8)$$

It can be seen from (5) through (8) that all parameters are programmable. The parameter $Q_o$ for LPF can be tuned independently by changing $\alpha_{P11}$ while for BPF by changing $\alpha_{P11}$ and $\alpha_{P13}$ together. The parameter $\omega_o$ can be programmed by changing $\alpha_{N12}$ and $\alpha_{P01}$ while $\alpha_{P11}$ and $\alpha_{N02}$ must be also tuned simultaneously to maintain constant $Q_o$ and gain, respectively. The gain of the LPF and BPF outputs can also be changed independently by $\alpha_{N02}$ and $\alpha_{P13}$, respectively. On the other hand, if each CA were assumed to have equal gain (i.e. $\alpha_{N12}=\alpha_{P11}=\alpha_{P13}=\alpha_1$ and $\alpha_{P01}=\alpha_{N02}=\alpha_0$), then only $\omega_o$ can be tuned by changing $\alpha_1$ and $\alpha_0$ simultaneously, whereas all other parameters will typically be uncontrollable.

The filter of FIG. 2 can be modified to realize a Kerwin Huelsman Newcomb (KHN) equivalent filter. The resulting topology of electronic KHN filter 300 is shown in FIG. 3 wherein a HPF output is introduced through adding CA2, and wherein a first CMOS current amplifier includes a band pass current output $I_{BP}$, a second CMOS current amplifier includes a low pass current output $I_{LP}$, and a third CMOS current amplifier includes a high pass current output $I_{HP}$.

Figure 3:
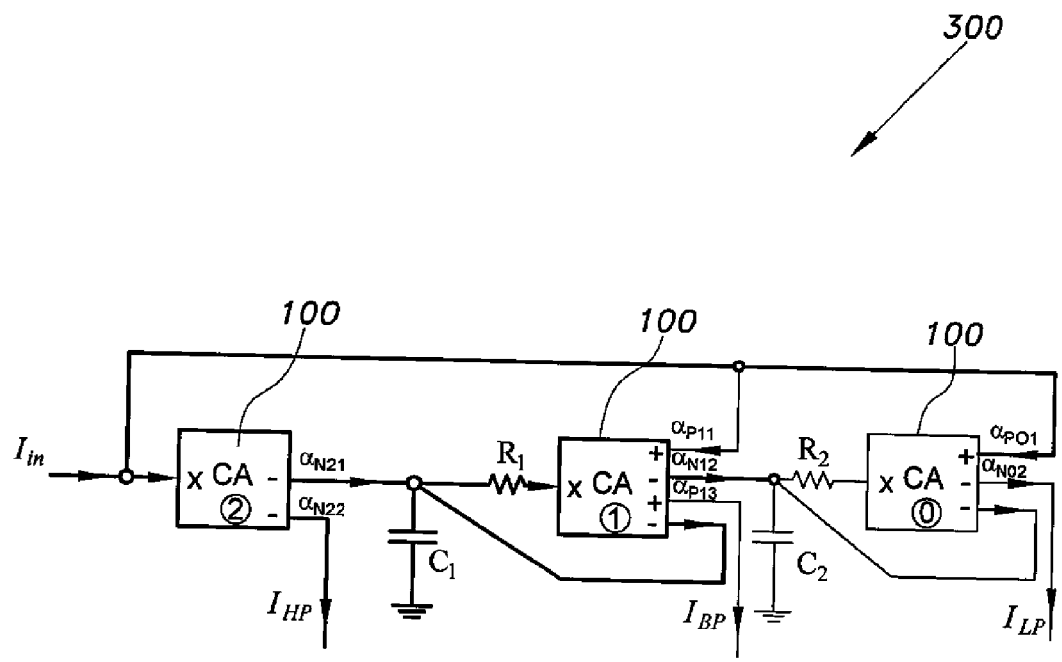
FIG. 3 is a block diagram of a KHN filter using the current amplifier circuit according to the present invention.

It can be shown that the filter of FIG. 3 exhibits the following transfer functions where $I_{lp}$ is a low pass current output, $I_{bp}$ is a band pass current output, $I_{in}$ is a source current, s is a Laplace transform parameter representing the complex frequency j$\omega$, $\omega_0$ is a programmable pole frequency, $Q_0$ is a programmable pole quality factor, $G_{lp}$ is a programmable low pass gain, $G_{bp}$ is a programmable band pass gain, $G_{hp}$ is a programmable high pass gain, the alpha-P ($\alpha_P$) are programming constants applied to positive differential outputs of the current amplifier circuit, alpha-N ($\alpha_N$) are programming constants applied to negative differential outputs of the current amplifier circuit, the ($\alpha_P$) and ($\alpha_N$) programming constants taking on values corresponding to respective differential pair tail currents, and where $C_1R_1$ is a product of a first integration RC circuit connected to the current amplifier, and $C_2R_2$ is a product of a second integration RC circuit connected to a second current amplifier:

$$\frac{I_{lp}}{I_{in}} = \frac{\alpha_{N02}\alpha_{N21}\alpha_{N12}/C_1C_2R_1R_2}{s^2 + s\alpha_{N21}\alpha_{P11}/C_1R_1 + \alpha_{N21}\alpha_{N12}\alpha_{P01}/C_1C_2R_1R_2}, \quad (9)$$

-continued $$\frac{I_{bp}}{I_{in}} = \frac{\alpha_{N21}\alpha_{P13}s/C_1R_1}{s^2 + s\alpha_{N21}\alpha_{P11}/C_1R_1 + \alpha_{N21}\alpha_{N12}\alpha_{P01}/C_1C_2R_1R_2}, \quad (10)$$

and $$\frac{I_{hp}}{I_{in}} = \frac{\alpha_{N22}s^2}{s^2 + s\alpha_{N21}\alpha_{P11}/C_1R_1 + \alpha_{N21}\alpha_{N12}\alpha_{P01}/C_1C_2R_1R_2}. \quad (11)$$

Therefore, the filter exhibits a pole frequency, a pole quality factor and a gain given by:

$$\omega_0 = \sqrt{\frac{\alpha_{N21}\alpha_{N12}\alpha_{P01}}{C_1C_2R_1R_2}}, \quad (12)$$

$$Q_0 = \sqrt{\frac{\alpha_{N12}}{\alpha_{N21}}}\frac{\sqrt{\alpha_{P01}}}{\alpha_{P11}}\sqrt{\frac{C_1R_1}{C_2R_2}}, \quad (13)$$

$$G_{LP} = \alpha_{N02}/\alpha_{P01}, \quad (14)$$

$$G_{BP} = \alpha_{P13}/\alpha_{P11}, \text{ and} \quad (15)$$

$$G_{hp} = \alpha_{N22}. \quad (16)$$

It can be seen from (12) through (16) that the proposed KHN has relatively complete independent control of various parameters. In this regard, the parameter $\omega_o$ can be programmed by changing $\alpha_{N12}$ and $\alpha_{N21}$, simultaneously. $Q_o$ for LPF can be tuned independently by changing $\alpha_{P11}$ and for BPF by changing $\alpha_{P11}$ and $\alpha_{P13}$ together. The gain of LPF, BPF and HPF can also be adjusted independently by $\alpha_{N02}$, $\alpha_{P13}$ and $\alpha_{P22}$, respectively. The current gain $\alpha_{P01}$ can be set to unity as it is not used for tuning. When the programmability requirements are relaxed, the required output stages can be reduced. For example, if gain tuning is unneeded, then the gains of CA2 and CA0 can be selected to be equal whereas only two different gains would be needed from CA1.

The non-ideal ac response of the filters can be found by considering the non-ideal effects of the CAs characterized by input parasitic impedance ($Z_x$) and output parasitic conductance ($Y_z$). Since the CA is designed to exhibit relatively low input impedance and relatively high output impedance, $Z_x$ and $Y_z$ are dominated by series resistance ($r_x$) and parallel capacitance ($C_z$), respectively. For the proposed filters, the effect of $C_z$ for all CAs can be easily observed as they are in parallel with the passive capacitances and their values can be absorbed. Also, $r_x$ for all CAs, except that of CA2 of FIG. 3 ($r_{x2}$), can be neglected as they are in series with passive resistors. A parasitic pole will manifest itself at relatively high frequency due to total capacitance ($2C_z$) at that terminal. The remaining non-ideality is due to the negative outputs of the CAs employed in local feedback loops to form lossless integrators. These gains can be precisely set to unity in simulation but will manifest themselves in practice due to transistor mismatches.

Denoting these gain errors by $\beta_{Ni}=1-\epsilon_{Ni}$ for respective CAs where $|\epsilon_{Ni}|\ll 1$, results in the following transfer functions for the TT topology, where a gain error $|\epsilon_{Ni}|\ll 1$, where Q is a programmable quality factor, $\omega_0$ is a programmable pole frequency, $I_{lp}$ is a low pass current output, $I_{bp}$ is a band pass current output, $I_{in}$ is a source current, the alpha-P ($\alpha_P$) are programming constants applied to positive differential outputs of the current amplifier circuit, alpha-N ($\alpha_N$) are programming constants applied to negative differential outputs of the current amplifier circuit, the ($\alpha_P$) and ($\alpha_N$) programming constants taking on values corresponding to respective differential pair tail currents, and where $C_1R_1$ is a product of a first integration RC circuit connected to the current amplifier, and $C_2R_2$ is a product of a second integration RC circuit connected to a second current amplifier, and s is a Laplace transform parameter representing the complex frequency jω:

$$\frac{I_{lp}}{I_{in}} = \frac{\alpha_{N02}\alpha_{N12}/C_1C_2R_1R_2}{s^2 + s(\omega_0/Q)_{non-ideal} + \omega^2_{0(non-ideal)}}, \quad (17)$$

$$\frac{I_{bp}}{I_{in}} = -\frac{\alpha_{P13}\left(\frac{\varepsilon_{N0}}{C_1C_2R_1R_2} + \frac{1}{C_1R_1}s\right)}{s^2 + s(\omega_0/Q)_{non-ideal} + \omega^2_{0(non-ideal)}}, \quad (18)$$

where, $$(\omega_0/Q)_{non-ideal} = \frac{\varepsilon_{N0}}{C_2R_2} + \frac{\varepsilon_{N1} + \alpha_{P11}}{C_1R_1}, \text{ and} \quad (19)$$

$$\omega^2_{0(non-ideal)} = \frac{\varepsilon_{N0}(\varepsilon_{N1} + \alpha_{P11})\alpha_{N12}\alpha_{P01}}{C_1C_2R_1R_2}. \quad (20)$$

Similarly, it can be shown that the non-ideal transfer functions for the proposed KHN, wherein a first CMOS current amplifier includes a band pass current output $I_{BP}$, a second CMOS current amplifier includes a low pass current output $I_{LP}$, and a third CMOS current amplifier includes a high pass current output $I_{HP}$ are given by:

$$\frac{I_{lp}}{I_{in}} = \frac{\alpha_{N02}\alpha_{N21}\alpha_{N12}/C_1C_2R_1R_2}{s^2 + s(\omega_0/Q)_{non-ideal} + \omega^2_{0(non-ideal)}}, \quad (21)$$

$$\frac{I_{bp}}{I_{in}} = -\frac{\alpha_{P13}\alpha_{N21}\left(\frac{\varepsilon_{N0}}{C_1C_2R_1R_2} + \frac{1}{C_1R_1}s\right)}{s^2 + s(\omega_0/Q)_{non-ideal} + \omega^2_{0(non-ideal)}}, \text{ and} \quad (22)$$

$$\frac{I_{hp}}{I_{in}} = \frac{\alpha_{N22}\left[s^2 + s\left(\frac{\varepsilon_{N0}}{C_2R_2} + \frac{\varepsilon_{N1}}{C_1R_1}\right) + \frac{\varepsilon_{N0}\varepsilon_{N1}}{C_1C_2R_1R_2}\right]}{s^2 + s(\omega_0/Q)_{non-ideal} + \omega^2_{0(non-ideal)}}, \quad (23)$$

where, $$(\omega_0/Q)_{non-ideal} = \frac{\varepsilon_{N0}}{C_2R_2} + \frac{\varepsilon_{N1} + \alpha_{N21}\alpha_{P11}}{C_1R_1}, \text{ and} \quad (24)$$

$$\omega^2_{0(non-ideal)} = \frac{\varepsilon_{N0}(\varepsilon_{N1} + \alpha_{N21}\alpha_{P11}) + \alpha_{N21}\alpha_{N12}\alpha_{P01}}{C_1C_2R_1R_2}. \quad (25)$$

Figure 4:
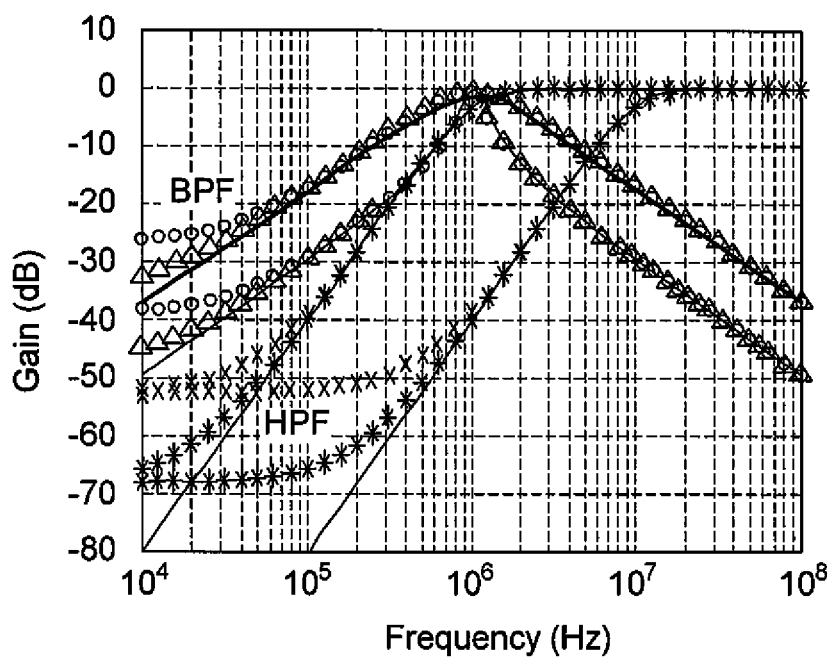
FIG. 4 is a gain vs. frequency plot for high pass filter (HPF) and band pass filter (BPF) versions of the current amplifier circuit according to the present invention.

Thus, it can be seen that various errors in $\beta_{Ni}$ can lead to some deviations in the denominator's coefficients but without introducing any new pole. These errors can be compensated for through the tuning features. However, the main problems come from the error terms appearing in the numerators of the HPF and BPF due to various $\epsilon_i$. Although these errors cannot be remedied, they are found to result in small deviations in low frequency bands. Plot 400 of FIG. 4 shows the non-ideal HPF responses for 5% and 2% error in the values of $\beta_{Ni}$, corresponding to $\epsilon_i$=−0.1 and −0.05. The passive elements are selected as $R_1=R_2=2$ kΩ, $C_1$=55 pF and $C_2$=110 pF (for 1 MHz pole frequency) and $C_1$=5.5 pF and $C_2$=11 pF (for 10 MHz pole frequency). It can be seen that for errors up to 5% the non-ideal response closely follows (within 1 dB difference) its ideal counterpart until stop band attenuation of about 40 dB. While for the case of 2% errors, the close agreement is extended to stop band attenuation of approximately 50 dB. Similar results were obtained for $\epsilon_i$=−0.1 and 0.05. Also, the non-ideal BPF responses are plotted in FIG. 4 for the cases of $Q_o$=0.707 and 3. It can be seen that the stop band attenuations for the low frequency sides is degraded slightly. For $Q_o$ of 0.707 the non-ideal responses closely follow their ideal counterparts until stop band attenuation of about 20 dB and 30 dB for respective errors of 5% and 2%. For the case of $Q_o$ of 3 ($\alpha_{P11}=\alpha_{P13}$=0.24), the close agreement is improved to stop band attenuations of about 30 dB and 40 dB for cases of 5% and 2% errors, respectively. In practice, the stop band attenuation is usually limited by a noise floor and/or non-ideal grounding to values in these ranges.

Figure 5:
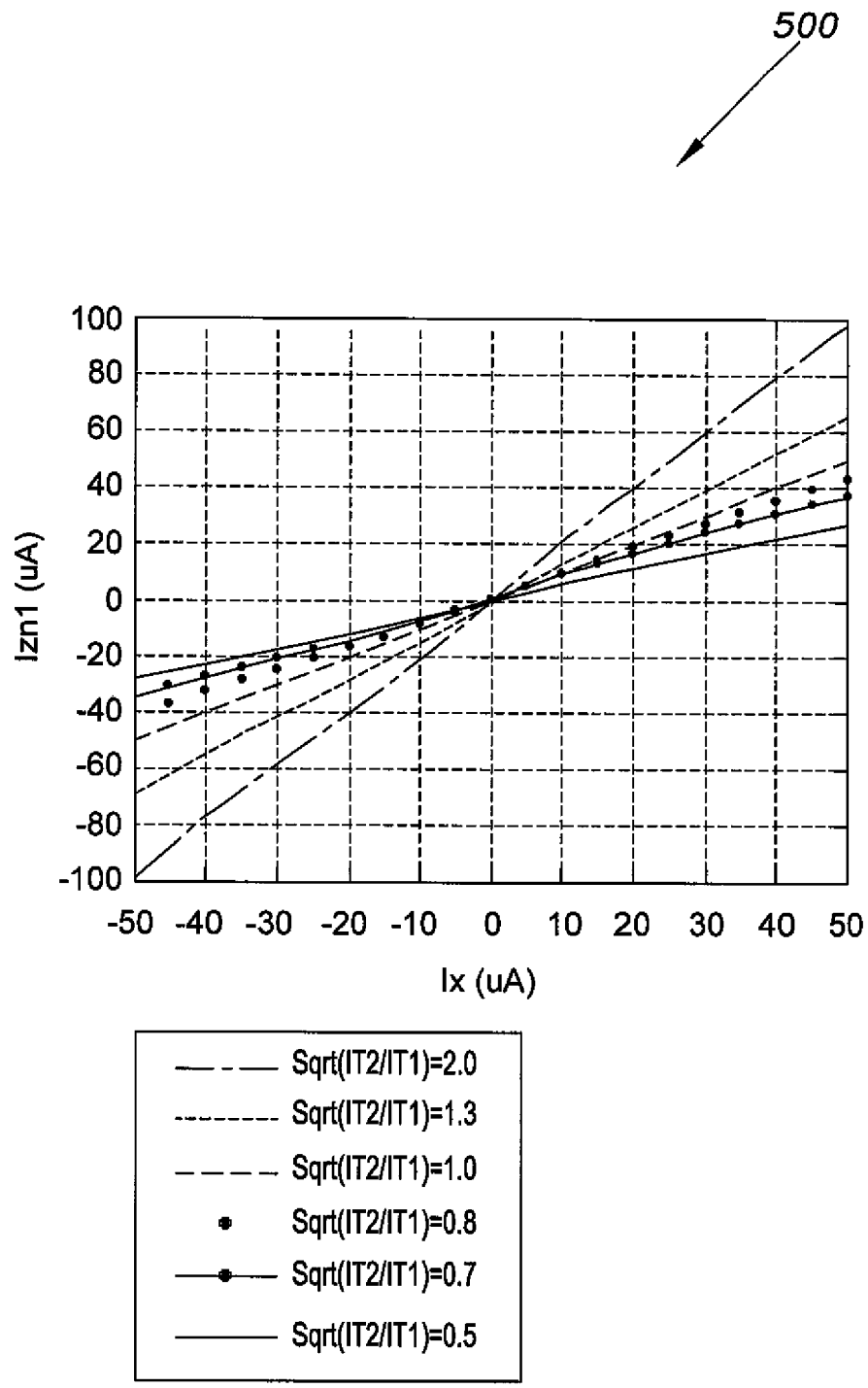
FIG. 5 is a measured DC transfer characteristic plot for various gain settings of the current amplifier circuit according to the present invention.

A CA based on the circuit 100 of FIG. 1 was fabricated in a standard 0.18 μm CMOS process. The supply voltages were set to ±0.75 V and the biasing currents were $I_{B1}=I_{B2}$=25 μA ($I_{M8}=I_{M9}=I_{M10}=I_{B1}$, $I_{M11}=6I_{B1}$, $I_{M18}=I_{B2}$, $I_{M17-nominal}=6I_{B2}$) leading to total current consumption of 0.55 mA. During testing, the floating dc current sources $I_{B1}$ and $I_{B2}$ are realized with passive resistors. Measured dc transfer characteristics of $I_{zn1}$ are shown in plot 500 of FIG. 5 wherein the current ratios $I_{zn1}/I_x$ are varied from 0.5 to 2.

Figure 6:
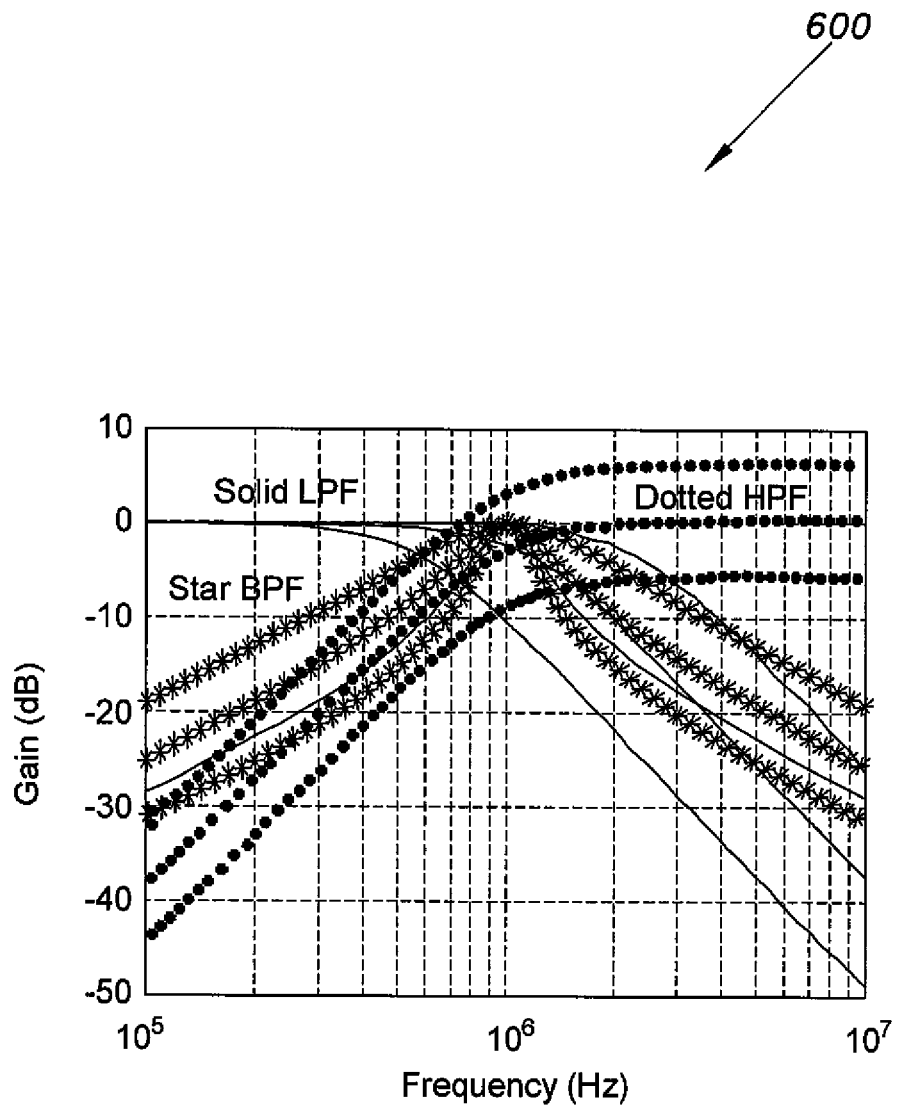
FIG. 6 is a bandwidth tuning plot for low pass filter (LPF), BPF and HPF settings of the current amplifier circuit according to the present invention.

Plot 600 of FIG. 6 shows various measured responses of the KHN filter 300 using passive components of $R_1=R_2$=2 kΩ, $C_1$=50 pF, and $C_2$=100 pF. It shows pole frequency tuning from 500 kHz to 2 MHz for the LPF, $Q_o$ tuning between 0.707 to 5 for the BPF, and gain adjustments from −6 dB to 6 dB for HPF.

Figure 7A:
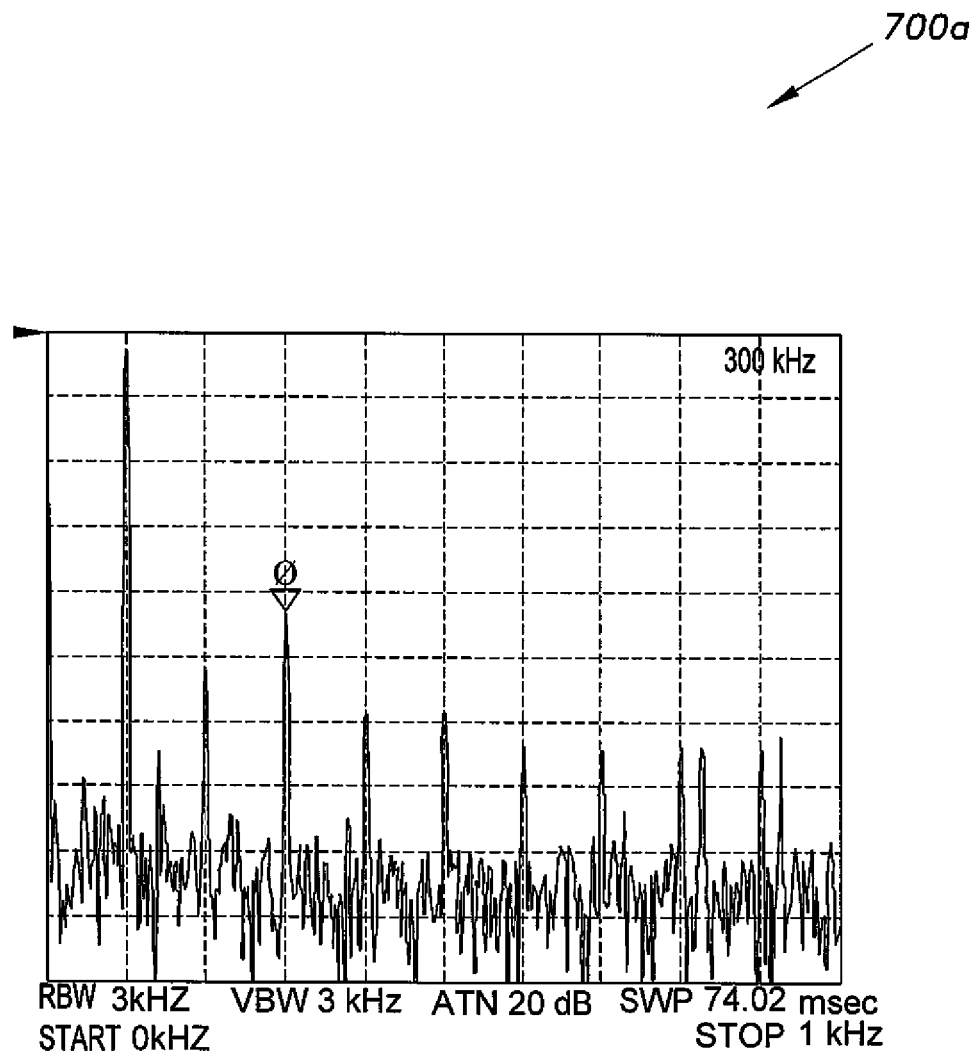
FIG. 7A is a harmonic distortion plot of the current amplifier circuit configured as a filter according to the present invention.
Figure 7B:
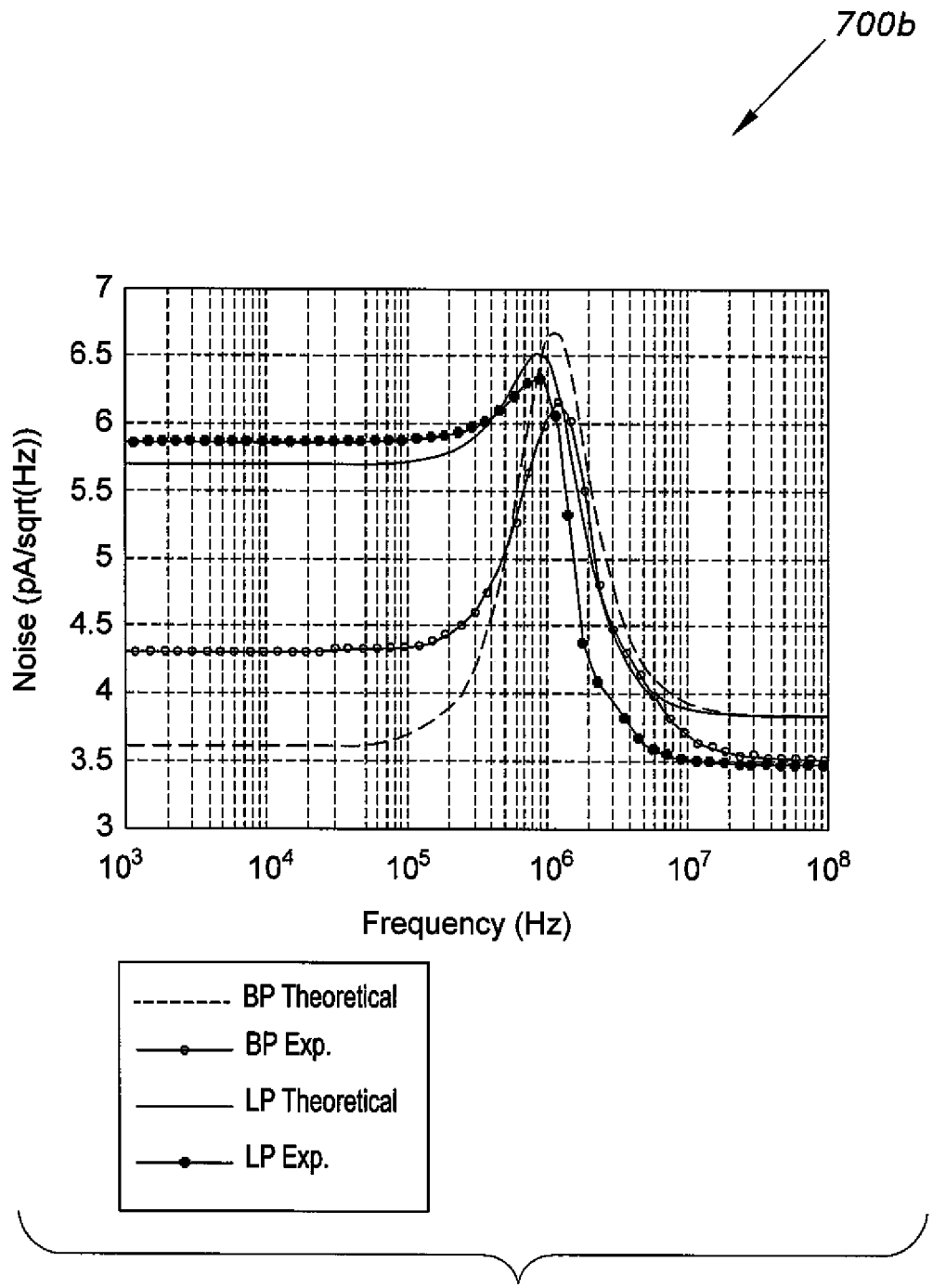
FIG. 7B is an output noise spectral density plot of the current amplifier circuit configured as a filter according to the present invention.

The linearity of the filter was determined by finding the input third-order intercept point (IIP3) determined by performing several intermodulation (IM3) tests using 800 kHz and 900 kHz signals. The filter can use a relatively low power consumption of 0.825 mW and can provide 5 functions simultaneously, for example. IIP3 estimation for in-band signals measured at the LPF output is found to be approximately −16 dBm (referenced to 50Ω). The spectrum of the output signal used to measure the dynamic range (DR) is shown in the plot 700a of FIG. 7A, with $H_{D3}$ being dominant. It can be found that the source signal associated with total harmonic distortion (THD)≈HD3 of −40 dB is about −3 dBm corresponding to an input current of 79 μA. The output noise root spectral density is shown in plot 700b of FIG. 7B for both the LPF and BPF. The total in-band noise for the LPF is found to be less than 6.3 nA (−117 dBm referenced to 50Ω) over a bandwidth of 1 MHz. Therefore, the corresponding in-band SFDR is 67.3 dB and DR is 82 dB. Table 1 summarizes the main characteristics of the filter.

TABLE 1

Summary of experimental results

| Filter | Measurement Results |
| --- | --- |
| Technology | 0.18 μm CMOS |
| Supply voltage | 1.5 V |
| Current | 0.55 mA |
| Filter order | $2^{nd}$ order |
| Active element | CA-RC |
| Tuning Method | Current Gains of CA |
| IIP3 (In-band) | −16 dBm |
| Input noise BW of 1 MHz | −117 dBm |
| SFDR (In-band) | 67.3 dB |
| DR (HD3 = −40 dB) | 82 dB |

Embodiments of a programmable multi-gain current amplifier as a multi-output CA exhibit independently programmable gains and do not typically require a condition on the circuit topologies. Therefore, embodiments of a programmable multi-gain current amplifier are relatively more versatile than CM or CCIII counterparts, for example. Further advantages of the programmable multi-gain current amplifier can be demonstrated through the designs of two-integratorloop biquads. Besides employing a true current-mode active element, the embodiments of the programmable multi-gain current amplifier filters use a relatively minimum number of active components of their kinds and, hence, can achieve optimum cost-efficient and relatively low power solutions. Experimental results obtained from 0.18 μm CMOS process of embodiments of the programmable multi-gain current amplifier also show an independent control of various parameters electronically. The design of a high-order filter, such as based on the biquad circuitry 200 of FIG. 2, can be used to implement channel select filters for digital video broadcasting-handheld (DVB-H) integrated direct-conversion receivers, for example.

It is to be understood that the present invention is not limited to the embodiments described above, but encompasses any and all embodiments within the scope of the following claims.

I claim:

1. A programmable multi-gain current amplifier circuit, comprising:
    a complementary metal oxide semiconductor (CMOS) current amplifier having an X terminal, and a unity gain output port Z, the CMOS current amplifier comprising:
    a first set of metal oxide semiconductor (MOS) transistors arranged in the CMOS current amplifier to set a voltage at said X terminal based on a negative feedback generated in the CMOS current amplifier;
    a current folding output stage including a second set of MOS transistors, the second set of MOS transistors being source-coupled to comprise a first differential set in which an input current $i_x$ is conveyed from said input port X to said output port Z,
    wherein the second set of MOS transistors is biased with a substantially constant tail current to provide the unity gain in which an output current $i_z$ is substantially equal to said input current $i_x$; and
    a third set of MOS transistors comprising a second differential set, the third set of MOS transistors being connected in parallel with the second set of MOS transistors,
    wherein the third set of MOS transistors is biased with a variable tail current to provide a programmable gain at least at a second current output port, said second differential set and said first differential set being biased with different tail currents, and a second current output gain being programmed responsive to an adjustment of said variable tail current.

2. The programmable multi-gain current amplifier circuit according to claim 1, further comprising:
    a second said CMOS current amplifier,
    wherein said second said CMOS current amplifier is communicatively connected to said CMOS current amplifier to provide an electronic filter having a Tow-Thomas (TT) topology.

3. The programmable multi-gain current amplifier circuit according to claim 2, wherein said TT electronic filter has:
    a programmable pole frequency $\omega_0$ having a value characterized by the relation:

$$\omega_0 = \sqrt{\frac{\alpha_{N12}\alpha_{P01}}{C_1 C_2 R_1 R_2}},$$

a programmable quality factor $Q_0$ having a value characterized by the relation:

$$Q_0 = \frac{\sqrt{\alpha_{N12}\alpha_{P01}}}{\alpha_{P11}} \sqrt{\frac{C_1 R_1}{C_2 R_2}},$$

a programmable low pass gain $G_{lp}$ having a value characterized by the relation:

$$G_{lp} = \alpha_{N02}/\alpha_{P01},$$

and
    a programmable band pass gain $G_{bp}$ having a value characterized by the relation:

$$G_{bp} = \alpha_{P13}/\alpha_{P11},$$

where the alpha-P ($\alpha_P$) are programming constants applied to positive differential outputs of said programmable multi-gain current amplifier circuit, alpha-N ($\alpha_N$) are programming constants applied to negative differential outputs of said programmable multi-gain current amplifier circuit, said ($\alpha_P$) and ($\alpha_N$) programming constants taking on values corresponding to respective differential pair tail currents, and where $C_1 R_1$ is a product of a first integration RC circuit connected to said CMOS current amplifier, and where $C_2 R_2$ is a product of a second integration RC circuit connected to said second said CMOS current amplifier; and
    wherein said CMOS current amplifier includes a bandpass current output $I_{BP}$ and said second said CMOS current amplifier includes a low pass current output $I_{LP}$.

4. The programmable multi-gain current amplifier circuit according to claim 1, further comprising:
    a second said CMOS current amplifier and a third said CMOS current amplifier,
    wherein said second said CMOS current amplifier and said third said CMOS current amplifier are communicatively connected with said CMOS current amplifier to provide an electronic filter having a Kerwin Huelsman Newcomb (KHN) topology.

5. The programmable multi-gain current amplifier circuit according to claim 4, wherein said KEN electronic filter has:
    a programmable pole frequency $\omega_0$ having a value characterized by the relation:

$$\omega_0 = \sqrt{\frac{\alpha_{N21}\alpha_{N12}\alpha_{P01}}{C_1 C_2 R_1 R_2}},$$

a programmable quality factor $Q_0$ having a value characterized by the relation:

$$Q_0 = \sqrt{\frac{\alpha_{N12}}{\alpha_{N21}}} \frac{\sqrt{\alpha_{P01}}}{\alpha_{P11}} \sqrt{\frac{C_1 R_1}{C_2 R_2}},$$

a programmable low pass gain $G_{LP}$ having a value characterized by the relation:

$$G_{LP} = \alpha_{N02}/\alpha_{P01},$$

a programmable band pass gain $G_{BP}$ having a value characterized by the relation:

$$G_{BP} = \alpha_{P13}/\alpha_{P11},$$

and a programmable high pass gain $G_{hp}$ having a value characterized by the relation:

$$G_{hp} = \alpha_{N22},$$

where the alpha-P ($\alpha_P$) are programming constants applied to positive differential outputs of said programmable multi-gain current amplifier, alpha-N ($\alpha_N$) are programming constants applied to negative differential outputs of said programmable multi-gain current amplifier, said ($\alpha_P$) and ($\alpha_N$) programming constants taking on values depending on their respective differential pair tail currents, and where $C_1R_1$ is a product of a first integration RC circuit connected to said CMOS current amplifier, and where $C_2R_2$ is a product of a second integration RC circuit connected to said second said CMOS current amplifier.

6. The programmable multi-gain current amplifier circuit according to claim 1, wherein said CMOS current amplifier produces a negative feedback driving said X terminal to approximately zero volts.

7. The programmable multi-gain current amplifier circuit according to claim 1, wherein an input resistance of said CMOS current amplifier is a few tens of ohms.

8. The programmable multi-gain current amplifier circuit according to claim 1, wherein the input current $i_x$ flows into a MOS transistor of said second set of MOS transistors by substantially constant currents in said CMOS current amplifier.

9. A programmable multi-gain current amplifier circuit, comprising:
  a complementary metal oxide semiconductor (CMOS) current amplifier having an X terminal, and a first unity gain differential output port Z;
  a first metal oxide semiconductor (MOS) transistor and a second MOS transistor arranged in said programmable multi-gain current amplifier circuit in combination with a third MOS transistor and a fourth MOS transistor, said circuit arrangement producing a negative feedback driving said X terminal to approximately zero volts, wherein constant currents of said second MOS transistor and said fourth MOS transistor flow into said third MOS transistor;
  a current folding output stage formed by a fifth MOS transistor arranged in said programmable multi-gain current amplifier circuit with said first, second, third and fourth MOS transistors, said third MOS transistor being source-coupled with said fifth MOS transistor to form a first differential pair in which an input current $i_x$ is conveyed from said input port X to said output port Z;
  means for biasing said third MOS transistor and said fifth MOS transistor with a constant tail current to provide the unity gain in which an output current $i_Z$ is equal to said input current $i_x$;
  a second differential pair of a sixth MOS transistor and a seventh MOS transistor connected in parallel with said third MOS transistor and said fifth MOS transistor; and
  means for biasing said sixth MOS transistor and said seventh MOS transistor with variable tail currents to provide programmable gains at second and third differential current output ports, said second differential pair and said first differential pair being biased with different tail currents, and second and third current output gains being programmed responsive to adjustment of said variable tail currents.

10. The programmable multi-gain current amplifier circuit according to claim 9, further comprising:
  a second CMOS current amplifier having the same circuit connections as said CMOS current amplifier; and
  means for connecting said second CMOS current amplifier with said CMOS current amplifier to provide an electronic filter having a Tow-Thomas (TT) topology.

11. The programmable multi-gain current amplifier circuit according to claim 9, further comprising:
  second and third programmable CMOS current amplifiers having the same circuit connections as said CMOS current amplifier; and
  means for connecting said second and third CMOS current amplifiers with said CMOS current amplifier to provide an electronic filter having a Kerwin Huelsman Newcomb (KHN) topology.

* * * * *